United States Patent
Yonemoto et al.

(10) Patent No.: US 10,807,494 B2
(45) Date of Patent: Oct. 20, 2020

(54) BATTERY MANAGEMENT SYSTEM, BATTERY SYSTEM AND HYBRID VEHICLE CONTROL SYSTEM

(71) Applicant: Vehicle Energy Japan Inc., Hitachinaka-shi, Ibaraki-ken (JP)

(72) Inventors: Masahiro Yonemoto, Tokyo (JP); Kei Sakabe, Tokyo (JP); Ryohhei Nakao, Hitachinaka (JP); Keiichiro Ohkawa, Hitachinaka (JP); Daiki Komatsu, Tokyo (JP)

(73) Assignee: Vehicle Energy Japan Inc., Hitachinaka-shi (JP)

( * ) Notice: Subject to any disclaimer, the term of this patent is extended or adjusted under 35 U.S.C. 154(b) by 0 days.

(21) Appl. No.: 16/082,805

(22) PCT Filed: Feb. 1, 2017

(86) PCT No.: PCT/JP2017/003511
§ 371 (c)(1),
(2) Date: Sep. 6, 2018

(87) PCT Pub. No.: WO2017/154419
PCT Pub. Date: Sep. 14, 2017

(65) Prior Publication Data
US 2019/0023132 A1    Jan. 24, 2019

(30) Foreign Application Priority Data
Mar. 9, 2016 (JP) .................................. 2016-045891

(51) Int. Cl.
*B60L 58/10* (2019.01)
*H01M 10/48* (2006.01)
(Continued)

(52) U.S. Cl.
CPC ................. *B60L 58/10* (2019.02); *B60L 3/00* (2013.01); *B60L 3/0023* (2013.01); *B60L 50/16* (2019.02);
(Continued)

(58) Field of Classification Search
CPC . H02J 7/00; B60L 58/12; G01R 31/36; G01R 31/382; H01M 10/48
See application file for complete search history.

(56) References Cited

U.S. PATENT DOCUMENTS 8,615,372 B2 *  12/2013  Tomura .................. H01M 10/48
                                                      702/63
8,963,502 B2 *   2/2015  Abe ........................ H01M 10/44
                                                      320/132

(Continued)

FOREIGN PATENT DOCUMENTS

EP    0711016 A2 *  5/1996
JP    8-83628 A     3/1996
(Continued)

OTHER PUBLICATIONS

International Search Report (PCT/ISA/210) issued in PCT Application No. PCT/JP2017/003511 dated Apr. 18, 2017 with English translation (three (3) pages).
(Continued)

*Primary Examiner* — Michael J Zanelli
(74) *Attorney, Agent, or Firm* — Crowell & Moring LLP

(57) ABSTRACT

The state of internal resistance is appropriately expressed for a battery being energized. A battery management system includes a battery information acquisition section, a voltage calculation section, a current fluctuation amount calculation section 109 and a resistance correction amount calculation section. The battery information acquisition section acquires a voltage value V of a storage battery being energized. The
(Continued)

voltage calculation section acquires a predicted battery voltage value $V_{model}$ of the storage battery being energized by a method different from that of the battery information acquisition section. The current fluctuation amount calculation section calculates a current fluctuation amount dI/dt of the storage battery per unit time. Based on the comparison result of the voltage value V and the predicted battery voltage value $V_{model}$ and the current fluctuation amount dI/dt, the resistance correction amount calculation section corrects an equivalent circuit model expressing the internal state of the storage battery including a DC resistance component $R_O$ and a polarization resistance component $R_p$.

7 Claims, 11 Drawing Sheets

(51) Int. Cl.

| | | |
|---|---|---|
| *B60L 3/00* | (2019.01) | |
| *H01M 10/42* | (2006.01) | |
| *G01R 31/36* | (2020.01) | |
| *H02J 7/00* | (2006.01) | |
| *B60L 50/16* | (2019.01) | |
| *B60L 58/12* | (2019.01) | |
| *G01R 31/382* | (2019.01) | |
| *H01M 10/0525* | (2010.01) | |

(52) U.S. Cl.
CPC .............. *B60L 58/12* (2019.02); *G01R 31/36* (2013.01); *G01R 31/382* (2019.01); *H01M 10/0525* (2013.01); *H01M 10/42* (2013.01); *H01M 10/425* (2013.01); *H01M 10/48* (2013.01); *H02J 7/00* (2013.01); *H01M 2010/4271* (2013.01); *Y02T 10/7005* (2013.01); *Y02T 10/7077* (2013.01)

(56) References Cited

U.S. PATENT DOCUMENTS

| | | | |
|---|---|---|---|
| 10,345,386 B2* | 7/2019 | Omi | G01R 31/367 |
| 10,444,296 B2* | 10/2019 | Miyamoto | G01R 31/3842 |
| 10,481,212 B2* | 11/2019 | Iida | G01R 31/3842 |
| 2013/0027047 A1 | 1/2013 | Yoshioka et al. | |
| 2014/0257726 A1* | 9/2014 | Baba | G01R 31/3648 |
| | | | 702/63 |
| 2016/0003912 A1 | 1/2016 | Iwane et al. | |
| 2016/0187429 A1* | 6/2016 | Kawai | G01R 31/367 |
| | | | 702/63 |

FOREIGN PATENT DOCUMENTS

| | | |
|---|---|---|
| JP | 2013-221790 A | 10/2013 |
| JP | 2014-178213 A | 9/2014 |
| WO | WO 2011/155017 A1 | 12/2011 |
| WO | WO 2014/080764 A1 | 5/2014 |

OTHER PUBLICATIONS

Japanese-language Written Opinion (PCT/ISA/237) issued in PCT Application No. PCT/JP2017/003511 dated Apr. 18, 2017 (three (3) pages).

* cited by examiner

BATTERY MANAGEMENT SYSTEM, BATTERY SYSTEM AND HYBRID VEHICLE CONTROL SYSTEM

TECHNICAL FIELD

The present invention relates to a battery management system for a secondary battery, a battery system, and a hybrid vehicle control system.

BACKGROUND ART

A secondary battery typified by a lithium ion secondary battery needs to be used in a suitable voltage range and a suitable range of a state of charge (hereinafter, referred to as an SOC). The reason is that there is a possibility that problems such as rapid progress of battery performance deterioration may occur if the secondary battery is used out of the suitable voltage range and suitable range of the SOC.

The SOC of the secondary battery is specified as the completely discharged state SOC=0% and the fully charged state SOC=100% and defined by the ratio of the amount of electric charge inputted/outputted into/from the battery with reference to these states. The SOC has a correlation with an open circuit voltage (OCV) of the battery when a sufficient time has elapsed since the ends of the charge/discharge. Therefore, the battery management apparatus, which manages the secondary battery, generally estimates and calculates the SOC based on sensor measurement results, such as a current, a voltage and a temperature, and the correlation between the SOC and the OCV described above.

As the estimation calculation method of the SOC, a so-called SOCi method and a so-called SOCv method have been known. The SOCi method is a method of obtaining the SOC by integrating the input/output current since the initial SOC of the battery. The SOCv method is a method of obtaining the SOC based on the OCV measurement result when the sufficient time has elapsed since the ends of the charge/discharge of the battery. In the SOCi method, the SOC can always be calculated even during the charge/discharge of the battery, and the SOC estimation result, which transitions smoothly as the time elapses, can be obtained. However, the current measurement value includes an offset error of a current sensor, and the offset error is also integrated if the current is integrated. Thus, there is a disadvantage that the estimation calculation result of the SOC diverges as the integration period becomes longer. On the other hand, in the SOCv method, the SOC estimation calculation result does not diverge unlike the SOCi method. However, the OCV of the battery cannot be measured during the charge/discharge or immediately after the charge/discharge. Thus, there is a problem that the SOC cannot be calculated directly.

In order to solve the above problem in the SOCv method, it is necessary to estimate the OCV by some method from a closed circuit voltage (CCV) of the battery measured during the charge/discharge or immediately after the charge/discharge. When the charge/discharge current of the battery is small, the SOC estimation error is small even if the SOC is estimated assuming CCV≈OCV. However, for example, in a case of a battery having a comparatively large charge/discharge current, such as an in-vehicle battery used in an HEV, a PHEV, an EV, or the like, the SOC estimation error becomes large since CCV≈OCV is not met.

Thereupon, in order to accurately estimate the SOC based on the CCV even in the secondary battery used for the application of the large charge/discharge current, a method of estimating the OCV from the CCV by using an equivalent circuit model according to the state of the battery to estimate the SOC by the SOCv method has been known. For example, the following PTLs 1 and 2 disclose techniques of sequentially computing equivalent circuit constants in an equivalent circuit model to estimate the SOC based on measurement values of a battery voltage and a current measured with the predetermined time intervals.

CITATION LIST

Patent Literature

PTL 1: WO 2011/155017
PTL 2: JP 2014-178213 A

SUMMARY OF INVENTION

Technical Problem

The internal resistance in a battery being energized generally includes a DC resistance component for a DC voltage component of a battery voltage, which instantaneously responds to a current change, and a polarization resistance component for a polarization voltage component of the battery voltage which responds exponentially. However, according to the method of computing the equivalent circuit constants described in PTLs 1 and 2, differences in the responsiveness to the current changes in each of such internal resistance components are not appropriately considered. Therefore, it is impossible to appropriately express the state of the internal resistance from the measurement values of the voltage and the current for the battery being energized.

Solution to Problem

A battery management system according to one aspect of the present invention is a battery management system, which calculates at least one of a charging rate of a secondary battery and an allowable current or an allowable power in consideration of a plurality of resistance components including a DC resistance component and a polarization resistance component, including: a plurality of computation means for obtaining a voltage value or the charging rate of the secondary battery; and a correction means for changing at least one of contribution degrees of the DC resistance component and the polarization resistance component for computations of the charging rate and the allowable current or the allowable power according to a comparison result of a plurality of voltage values or charging rates obtained by the plurality of the computation means and a fluctuation amount of a current of the secondary battery per unit time. A battery management system according to another aspect of the present invention includes: a first voltage acquisition section which acquires a voltage value of a secondary battery being energized as a first voltage value; a second voltage acquisition section which acquires a voltage value of the secondary battery being energized as a second voltage value by a method different from that of the first voltage acquisition section; a current fluctuation amount calculation section which calculates a current fluctuation amount of the secondary battery per unit time; and a resistance correction amount calculation section which corrects an equivalent circuit model expressing an internal state of the secondary battery including a DC resistance component and a polarization resistance component based on a comparison result of the first voltage value and the second voltage value and the current fluctuation amount.

A battery management system according to a still another aspect of the present invention includes: a first state of charge acquisition section which acquires a state of charge of a secondary battery being energized as a first state of charge; a second state of charge acquisition section which acquires a state of charge of the secondary battery being energized as a second state of charge by a method different from that of the first state of charge acquisition section; a current fluctuation amount calculation section which calculates a current fluctuation amount of the secondary battery per unit time; and a resistance correction amount calculation section which corrects an equivalent circuit model expressing an internal state of the secondary battery including a DC resistance component and a polarization resistance component based on a comparison result of the first state of charge and the second state of charge and the current fluctuation amount.

A battery system according to the present invention includes a battery management system; a secondary battery managed by the battery management system; and a charge/discharge control section which controls a charge/discharge current of the secondary battery based on an allowable current or allowable power calculated by an allowable calculation section.

A hybrid vehicle control system according to the present invention includes: an engine and a motor provided through a power split mechanism; and a battery system, in which driving force distributions for the engine and the motor are controlled according control of the charge/discharge current by the charge/discharge control section.

Advantageous Effects of Invention

According to the present invention, it is possible to appropriately express the state of the internal resistance for the battery being energized.

DESCRIPTION OF EMBODIMENTS

Hereinafter, embodiments of the present invention will be described with reference to the drawings.

First Embodiment

Figure 1:
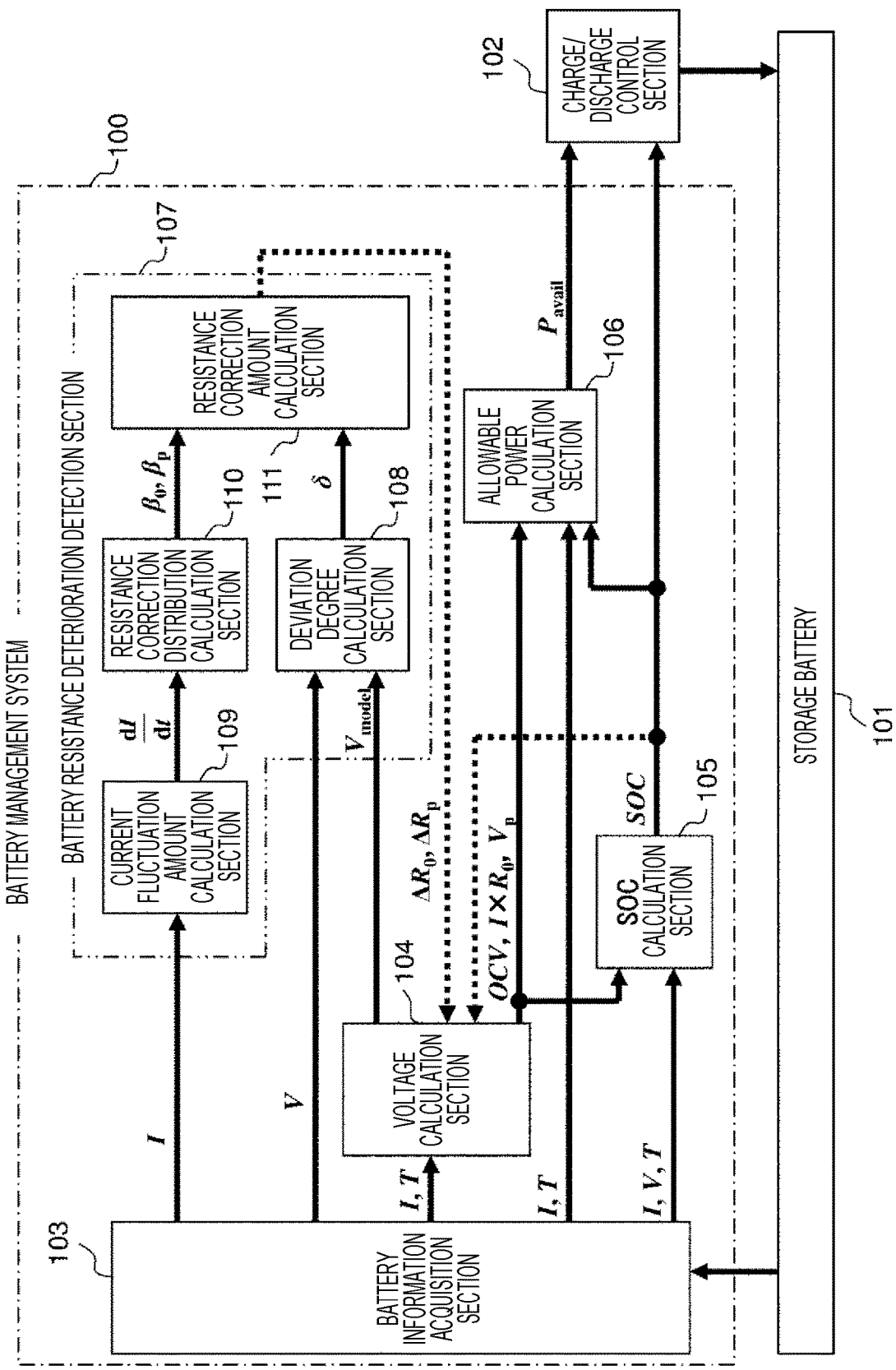
FIG. 1 is a diagram showing a first embodiment of a battery system according to the present invention.
Figure 2:
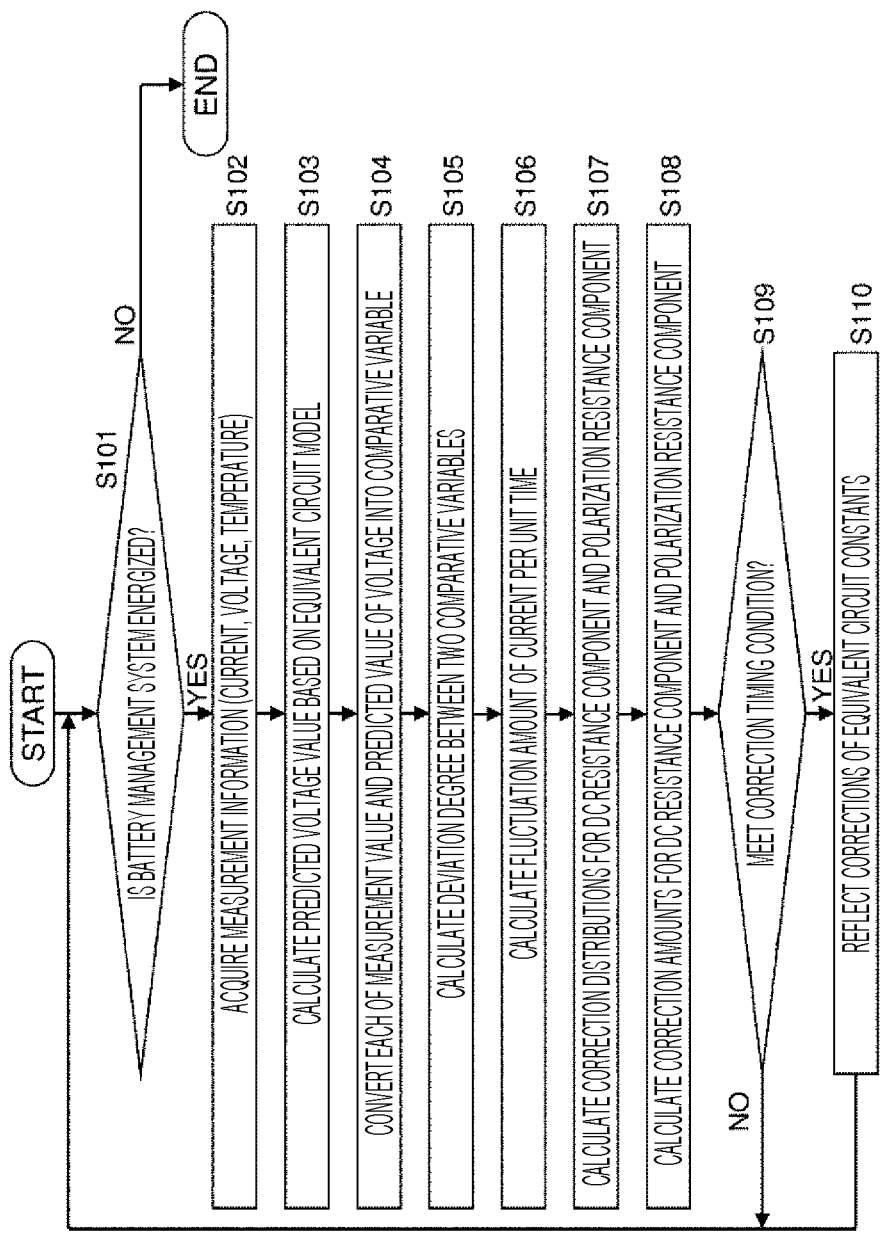
FIG. 2 is a diagram showing one example of a control flowchart according to the first embodiment.

FIGS. 1 and 2 are diagrams for explaining a first embodiment of a battery management system according to the present invention. For example, a battery system of the present embodiment is mounted on a hybrid vehicle such as an HEV or a PHEV.

FIG. 1 is a block diagram showing the minimum configuration of a battery system 1 according to the first embodiment of the present invention. The battery system 1 includes a battery management system 100, a storage battery 101 and a charge/discharge control section 102. The storage battery 101 is a secondary battery including a plurality of storage elements (e.g., lithium ion secondary battery cells).

The battery management system 100 includes a battery information acquisition section 103, a voltage calculation section 104, an SOC calculation section 105, an allowable power calculation section 106 and a battery resistance deterioration detection section 107. The battery resistance deterioration detection section 107 includes a deviation degree calculation section 108, a current fluctuation amount calculation section 109, a resistance correction distribution calculation section 110 and a resistance correction amount calculation section 111.

The battery information acquisition section 103 acquires measurement information, such as a current I, a voltage V and temperature T, based on signals outputted from a current sensor, a voltage sensor, a temperature sensor and the like attached to the storage battery 101 or the periphery thereof. Then, the measurement information is outputted to each of the voltage calculation section 104, the SOC calculation section 105, the allowable power calculation section 106, the deviation degree calculation section 108 and the current fluctuation amount calculation section 109.

Based on the current I and the temperature T outputted from the battery information acquisition section 103, the voltage calculation section 104 calculates (predicts) the battery voltage of the storage battery 101 being energized and outputs the calculation result as a predicted battery voltage value $V_{model}$ to the deviation degree calculation section 108. The voltage calculation section 104 also calculates an open circuit voltage OCV, a DC voltage component $I \times R_0$ and a polarization voltage component $V_p$, which are the constituent components of the calculated battery voltage, and outputs the calculation results to the SOC calculation section 105 and the allowable power calculation section 106. Note that an equivalent circuit model expressing the internal state of the storage battery 101 is stored in advance in the voltage calculation section 104 as described later. By using this equivalent circuit model, the voltage calculation section 104 can calculate the predicted battery voltage value $V_{model}$ and the constituent components OCV, $I \times R_0$ and $V_p$ thereof.

Based on the current I, the voltage V and the temperature T outputted from the battery information acquisition section 103 and the OCV, the $I \times R_0$ and the $V_p$ calculated by the voltage calculation section 104, the SOC calculation section 105 calculates an SOC of the storage battery 101. For example, the SOC calculation section 105 may calculate the SOC by an SOCv method based on the OCV or may calculate the SOC by an SOCi method based on a history of the current I. Alternatively, the SOC may be calculated by an SOCc method using a combination of the SOCv method and the SOCi method. The SOC calculation section 105 outputs the calculation result of the SOC to the allowable power calculation section 106 and the charge/discharge control section 102 as well as to the voltage calculation section 104. The calculation result of the SOC outputted from the SOC calculation section 105 is used by the voltage calculation section 104 to determine each equivalent circuit constant in the equivalent circuit model.

Based on the current I and the temperature T outputted from the battery information acquisition section 103, the OCV, the $I \times R_0$ and the $V_p$ calculated by the voltage calculation section 104, and the SOC outputted from the SOC calculation section 105, the allowable power calculation section 106 calculates an allowable value $P_{avail}$ for the charge/discharge of the storage battery 101. Herein, the allowable value $P_{avail}$ is a control parameter indicating an upper limit current value (allowable charge/discharge current) that can flow to the storage battery 101 at the time of the charge/discharge, an upper limit power value (allowable charge/discharge power) that can be inputted/outputted into/from the storage battery 101, an SOC operation range of the storage battery 101, a temperature operation range of the storage battery 101, or the like. The allowable power calculation section 106 outputs the calculation result of the allowable value $P_{avail}$ to the charge/discharge control section 102.

Based on the voltage V outputted from the battery information acquisition section 103 and the predicted battery voltage value $V_{model}$ outputted from the voltage calculation section 104, the deviation degree calculation section 108 computes a deviation degree δ between these voltage values. The deviation degree calculation section 108 outputs the calculated deviation degree δ to the resistance correction amount calculation section 111.

Based on the current I outputted from the battery information acquisition section 103, the current fluctuation amount calculation section 109 calculates a current fluctuation amount dI/dt of the storage battery 101 per unit time from the previous computed time to the present time. Herein, the battery information acquisition section 103 acquires the current I at each predetermined measurement cycle, and the current fluctuation amount calculation section 109 can computes the current fluctuation amount dI/dt at the measurement cycle of the current I as a unit time by obtaining the change amount of the current I at each measurement cycle. The current fluctuation amount calculation section 109 outputs the calculated current fluctuation amount dI/dt to the resistance correction distribution calculation section 110.

Based on the current fluctuation amount dI/dt outputted from the current fluctuation amount calculation section 109, the resistance correction distribution calculation section 110 calculates correction distributions $\beta_0$ and $\beta_p$ or a DC resistance component $R_0$ and a polarization resistance component $R_p$ in the equivalent circuit model, respectively. Note that the DC resistance component $R_0$ corresponds to the DC voltage component $I \times R_0$ of the battery voltage previously mentioned, and the polarization resistance component $R_p$ corresponds to the polarization voltage component $V_p$ of the battery voltage.

Based on the deviation degree δ outputted from the deviation degree calculation section 108 and the correction distributions $\beta_0$ and $\beta_p$ outputted from the resistance correction distribution calculation section 110, the resistance correction amount calculation section 111 calculates a correction amount $\Delta R_0$ for the DC resistance component $R_0$ and a correction amount $\Delta R_p$ for the polarization resistance component $R_p$. The resistance correction amount calculation section 111 outputs the calculated correction amounts $\Delta R_0$ and $\Delta R_p$ to the voltage calculation section 104 to correct the DC resistance component $R_0$ and the polarization resistance component $R_p$ of the equivalent circuit model stored in the voltage calculation section 104.

In the battery resistance deterioration detection section 107, the correction amounts $\Delta R_0$ and $\Delta R_p$ for correcting the equivalent circuit model can be calculated based on the predicted battery voltage value $V_{model}$ and the measurement values of the voltage V and the current I by each of the operations of the deviation degree calculation section 108, the current fluctuation amount calculation section 109, the resistance correction distribution calculation section 110 and the resistance correction amount calculation section 111 as described above.

Based on the calculation result of the SOC outputted from the SOC calculation section 105 and the calculation result of the allowable value $P_{avail}$ outputted from the allowable power calculation section 106, the charge/discharge control section 102 controls the charge/discharge current flowing in the storage battery 101.

FIG. 2 is a diagram showing one example of a control flowchart according to the first embodiment of the present invention. This control program is executed in the battery management system 100 in FIG. 1. The series of processing shown in FIG. 2 is performed with predetermined time intervals.

In Step S101, whether or not the battery management system 100 is energized is determined. The processing is stopped if the battery management system 100 is not energized. The processing proceeds to Step S102 if the battery management system 100 is energized. Herein, the predetermined time is a time interval indicating a control cycle for calculating the resistance correction amounts based on the present invention. For example, a time of 0.1 seconds or the like is selected.

In Step S102, the battery information acquisition section 103 acquires the measurement information such as the current I, the voltage V and the temperature T of the storage battery 101.

In Step S103, by using the measurement values of the current I and the temperature T acquired in Step S102 and the present SOC value, the voltage calculation section 104 computes the predicted battery voltage value $V_{model}$ based on the equivalent circuit model expressing the internal state of the storage battery 101.

Figure 3:
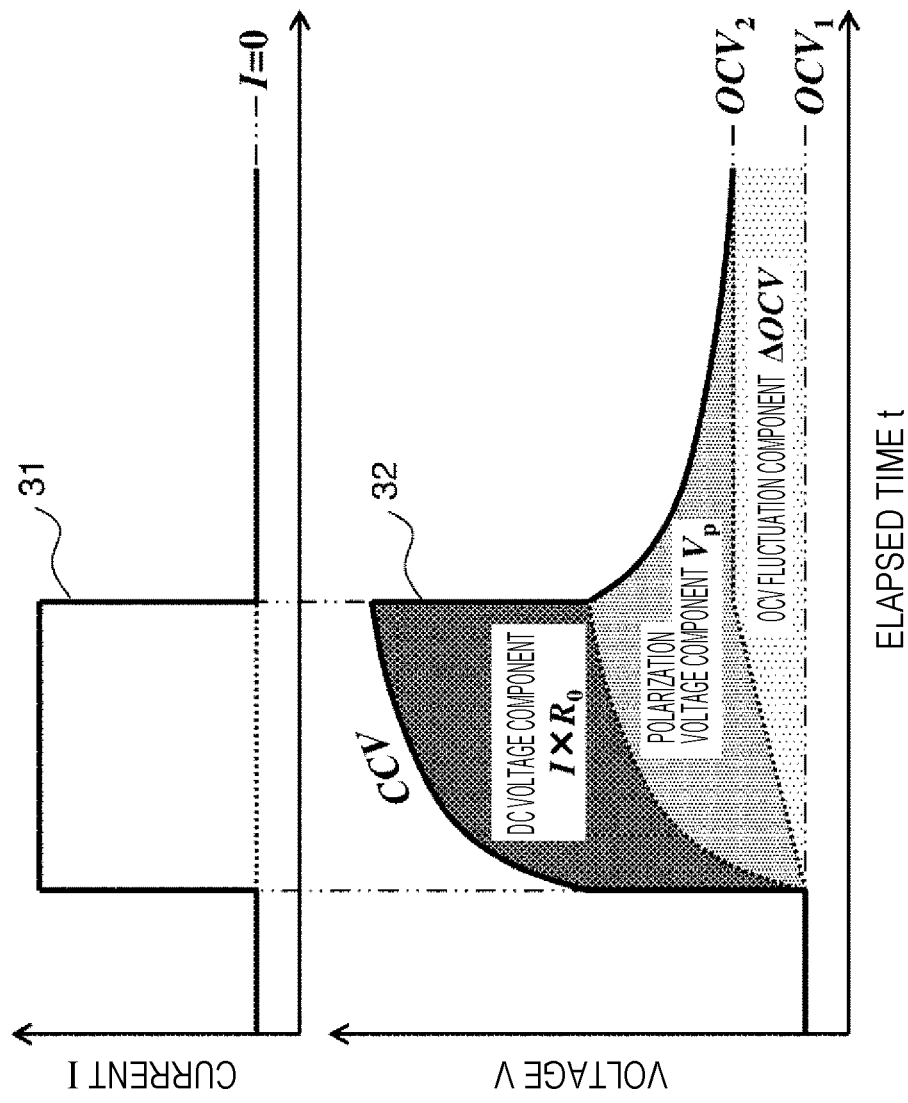
FIG. 3 is a diagram showing one example of battery voltage behavior when a rectangular current wave is applied to a storage battery.

Herein, the equivalent circuit model used in the voltage calculation section 104 will be described with reference to FIGS. 3 and 4. FIG. 3 is a diagram showing one example of battery voltage behavior when a rectangular current wave is applied to the storage battery 101. For example, when a current I with a rectangular wave shown in a graph 31 is applied to the storage battery 101, the voltage V of the storage battery 101 at this time, that is, the CCV of the storage battery 101 changes as shown in a graph 32. As shown in FIG. 3, this change in the voltage V is roughly classified into three components, the DC voltage component $I \times R_0$, the polarization voltage component $V_p$ and an OCV fluctuation component $\Delta OCV$.

The DC voltage component $I \times R_0$, which is the first component, instantaneously responds to the change in the current I. That is, the DC voltage component $I \times R_0$ instantaneously increases according to the rise of the current I, transitions at a certain level, and then disappears with the fall of the current I.

The polarization voltage component $V_p$, which is the second component, fluctuates exponentially according to the change in the current I. That is, the polarization voltage component $V_p$ increases gradually according to the rise of the current I and gradually decreases according to the fall of the current I.

The OCV fluctuation component $\Delta$OCV, which is the third component, represents the change in the OCV of the storage battery 101 and corresponds to a difference between $OCV_1$, which is an OCV value before the start of the charge, and $OCV_2$, which is an OCV value after the start of the charge. This OCV fluctuation component $\Delta$OCV accords with a change amount of the SOC of the storage battery 101 according to the current I.

Figure 4:
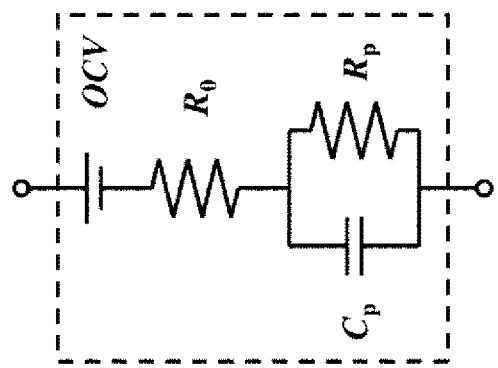
FIG. 4 is a diagram showing one example of an equivalent circuit model of the storage battery.

FIG. 4 is a diagram showing one example of the equivalent circuit model of the storage battery 101. In FIG. 4, $R_0$ denotes the DC resistance component. By multiplying the DC resistance component $R_0$ by the current I, the DC voltage component I×$R_0$ previously mentioned is obtained. Meanwhile, $R_p$ and $C_p$ denote the polarization resistance component and a polarization capacity component, respectively, and the polarization voltage component $V_p$ previously mentioned is obtained from these values. Moreover, OCV denotes the open circuit voltage of the storage battery 101, and the OCV fluctuation component $\Delta$OCV is obtained from the change amount of this OCV.

Note that suppose that the polarization resistance component $R_p$ and the polarization capacity component $C_p$ are inversely proportional to each other in the following description. Moreover, a time constant $\tau$ representing the exponential fluctuation of the polarization voltage component $V_p$ shown in FIG. 3 is constant regardless of the deterioration state of the storage battery 101.

To express the equivalent circuit model as described above, the values of the corresponding OCV, $R_0$, $R_p$ and $C_p$ are stored in the voltage calculation section 104 as equivalent circuit constants for each of the values of the temperature and the SOC of the storage battery 101. In Step S103 in FIG. 2, values of these equivalent circuit constants are determined based on the value of the temperature T acquired in Step S102 and the value of the latest SOC obtained in the SOC calculation section 105. Then, based on the determined values of the equivalent circuit constants and the value of the current I acquired in Step S102, the predicted battery voltage value $V_{model}$ is computed.

In Step S104, the deviation degree calculation section 108 converts each of the measurement value of the voltage V acquired in Step S102 and the predicted battery voltage value $V_{model}$ obtained in Step S103 into a comparative variable by using a predetermined calculation formula to compare each other. Herein, the above comparison variable may be any index as long as a difference in the characteristics between the voltage V and the predicted battery voltage value $V_{model}$ can be appropriately compared. For example, differential values of these values, integrated values of absolute differential values, and the like can be used as the comparative variables. Alternatively, the values of the voltage V and the predicted battery voltage value $V_{model}$ may be directly used as the comparison variables. In addition, various values obtained from the voltage V and the predicted battery voltage value $V_{model}$ can be used as the comparative variables.

In Step S105, based on the comparative variables of the voltage V and the predicted battery voltage value $V_{model}$ obtained in Step S104, the deviation degree calculation section 108 calculates the deviation degree $\delta$ indicating the comparison result of these values. Herein, the above deviation degree $\delta$ may be any index appropriately indicating a difference in the characteristics between the voltage V and the predicted battery voltage value $V_{model}$. For example, a difference between these comparison variables or a ratio thereof can be used. In addition, various values obtained from each of the comparison variables of the voltage V and the predicted battery voltage value $V_{model}$ can be used as the deviation degree $\delta$.

In Step S106, based on the measurement value of the current I acquired in Step S102, the current fluctuation amount calculation section 109 calculates the current fluctuation amount dI/dt of the storage battery 101 per unit time.

In Step S107, based on the current fluctuation amount dI/dt per unit time obtained in Step S106, the resistance correction distribution calculation section 110 calculates the correction distributions $\beta_0$ and $\beta_p$ for the DC resistance component $R_0$ and the polarization resistance component $R_p$ in the equivalent circuit model, respectively. Herein, based on correction distribution information, which is stored in the resistance correction distribution calculation section 110 in advance and indicates the relationships between the current fluctuation amount dI/dt and these correction distributions, the correction distributions $\beta_0$ and $\beta_p$ for the DC resistance component $R_0$ and polarization resistance component $R_p$ according to the value of the present current fluctuation amount dI/dt are determined.

Note that, in the above correction distribution information, the correction distribution $\beta_0$ for the DC resistance component $R_0$ and the correction distribution $\beta_p$ for the polarization resistance component $R_p$ are preferably set to be inversely correlated with each other for the change in the current fluctuation amount dI/dt per unit time. Specifically, it is necessary for the ratio of the correction distribution $\beta_0$ for the DC resistance component $R_0$ to the correction distribution $\beta_p$ for the polarization resistance component $R_p$ to meet a positive correlation with the absolute value |dI/dt| of the current fluctuation amount.

Figure 5:
FIG. 5 is a diagram showing one example of correction distribution information.
Figure 6:
FIG. 6 is a diagram showing one example of the correction distribution information.
Figure 7:
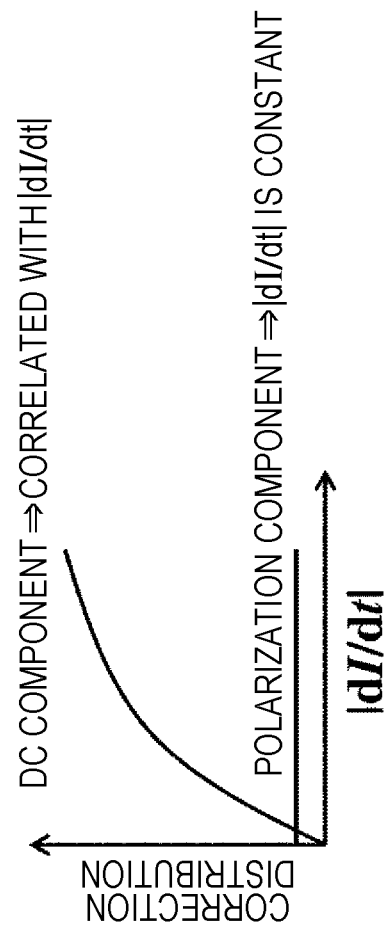
FIG. 7 is a diagram showing one example of the correction distribution information.

Examples of the correction distribution information that meets the above requirement are shown in FIGS. 5 to 7. FIG. 5 shows an example of the correction distribution information in which the correction distribution $\beta_0$ for the DC resistance component $R_0$ is correlated and the correction distribution $\beta_p$ for the polarization resistance component $R_p$ is inversely correlated with the change in |dI/dt|. In this example, as |dI/dt| increases, the correction distribution $\beta_0$ for the DC resistance component $R_0$ increases accordingly, while the correction distribution $\beta_p$ for the polarization resistance component $R_p$ decreases. And, as |dI/dt| decreases, the correction distribution $\beta_0$ for the DC resistance component $R_0$ decreases accordingly, while the correction distribution $\beta_p$ for the polarization resistance component $R_p$ increases. Therefore, it can be seen that the correction distribution $\beta_0$ for the DC resistance component $R_0$ and the correction distribution $\beta_p$ for the polarization resistance component $R_p$ change in inverse correlation with each other for the change in the current fluctuation amount dI/dt.

FIG. 6 shows an example of the correction distribution information in which the correction distribution $\beta_0$ for the DC resistance component $R_0$ is constant and the correction distribution $\beta_p$ for the polarization resistance component $R_p$ is inversely correlated with the change in |dI/dt| in a range equal to or greater than a predetermined threshold value. In this example, as |dI/dt| increases in the range equal to or greater than the threshold value, the correction distribution $\beta_O$ for the DC resistance component $R_O$ is constant and does not change, while the correction distribution $\beta_p$ for the polarization resistance component $R_p$ decreases. And, as |dI/dt| decreases in the range equal to or greater than the threshold value, the correction distribution $\beta_O$ for the DC resistance component $R_O$ is constant and does not change, while the correction distribution $\beta_p$ for the polarization resistance component $R_p$ increases. Therefore, it can be seen that the correction distribution $\beta_O$ for the DC resistance component $R_O$ and the correction distribution $\beta_p$ for the polarization resistance component $R_p$ change in inverse correlation with each other for the change in the current fluctuation amount dI/dt.

FIG. 7 shows an example of the correction distribution information in which the correction distribution $\beta_O$ for the DC resistance component $R_O$ is correlated and the correction distribution $\beta_p$ for the polarization resistance component $R_p$ is constant with the change in |dI/dt|. In this example, as |dI/dt| increases, the correction distribution $\beta_O$ for the DC resistance component $R_O$ increases accordingly, while the correction distribution $\beta_p$ for the polarization resistance component $R_p$ is constant and does not change. And, as |dI/dt| decreases, the correction distribution $\beta_O$ for the DC resistance component $R_O$ decreases accordingly, while the correction distribution $\beta_p$ for the polarization resistance component $R_p$ is constant and does not change. Therefore, it can be seen that the correction distribution $\beta_O$ for the DC resistance component $R_O$ and the correction distribution $\beta_p$ for the polarization resistance component $R_p$ change in inverse correlation with each other for the change in the current fluctuation amount dI/dt.

In the resistance correction distribution calculation section 110, the information indicating the relationships as described above is stored as the correction distribution information. In Step S107 in FIG. 2, based on such correction distribution information and the value of the current fluctuation amount dI/dt per unit time obtained in Step S106, the correction distributions $\beta_O$ and $\beta_p$ for the DC resistance component $R_O$ and the polarization resistance component $R_p$ are determined, respectively.

Note that FIGS. 5 to 7 described above are extractions of one example of the correction distribution information meeting the requirement previously mentioned. Therefore, the correction distribution information stored in the resistance correction distribution calculation section 110 is not limited to those having the relationships shown in FIGS. 5 to 7. Moreover, as for the relationships shown in FIG. 5 to FIG. 7, any one of a calculation method based on data table and a calculation method based on functions may be selected.

In Step S108, based on the deviation degree δ obtained in Step S105 and the correction distributions $\beta_O$ and $\beta_p$ for the DC resistance component $R_O$ and the polarization resistance component $R_p$ obtained in Step S107, the resistance correction amount calculation section 111 calculates a correction amount for correcting each of the values of the DC resistance component $R_O$ and the polarization resistance component $R_p$. Specifically, by multiplying the correction distribution $\beta_O$ for the DC resistance component $R_O$ and the correction distribution $\beta_p$ for the polarization resistance component $R_p$ by the deviation degree δ, the resistance correction amount calculation section 111 computes the correction amount for each of the DC resistance component $R_O$ and the polarization resistance component $R_p$. By outputting the correction amounts thus obtained to the voltage calculation section 104 from the resistance correction amount calculation section 111, the resistance correction amount calculation section 111 can correct the equivalent circuit model of the storage battery 101 stored in the voltage calculation section 104.

In Step S109, whether or not a correction timing condition is met is determined. If the correction timing condition is met, the processing proceeds to Step S110. If the correction timing condition is not met, the processing returns to Step S101. Herein, for example, it is possible to determine that the correction timing condition is met when a predetermined time or more has elapsed since the previous correction, or at a timing when highly accurate correction results can be obtained.

In Step S110, the voltage calculation section 104 reflects the correction amounts for the DC resistance component $R_O$ and the polarization resistance component $R_p$ obtained in Step S108 in the equivalent circuit constants of the equivalent circuit model. Thus, the corrections of the equivalent circuit model by the resistance correction amount calculation section 111 are applied in the voltage calculation section 104. After applying the corrections in this way, the processing returns to Step S101. Note that, herein, the corrections are applied only when the correction timing condition is determined to be met in Step S109, but the corrections may be always performed continuously so that the correction amounts obtained according to the determination result in Step S109 are weighted.

Figure 8:
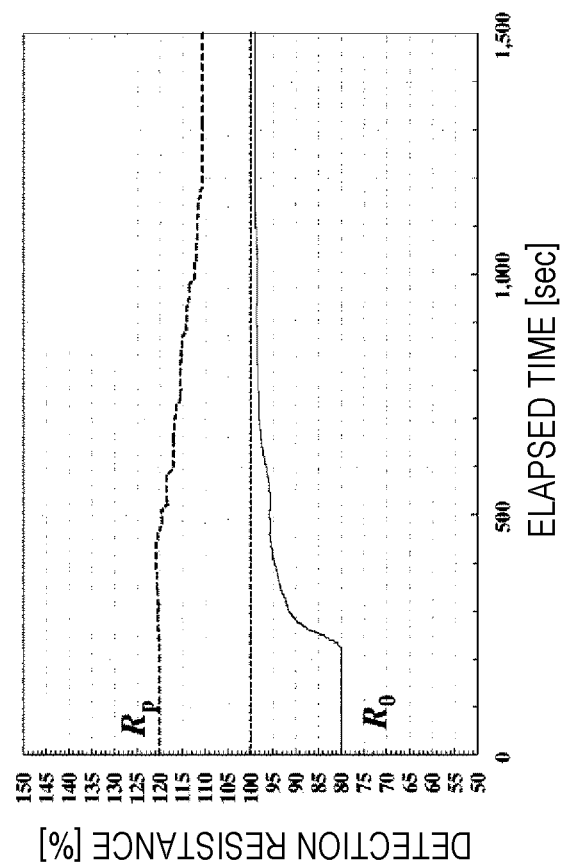
FIG. 8 is a diagram showing one example of resistance detection results by a battery management system.

FIG. 8 is a diagram showing one example of the resistance detection results by the battery management system 100. In FIG. 8, it can be confirmed that both the DC resistance component $R_O$ and the polarization resistance component $R_p$ approach the true value of 100% as time elapses.

According to the first embodiment of the present invention described above, the following operational effects are exerted.

(1) The battery management system 100 calculates at least one of the SOC of the storage battery 101 and the allowable value $P_{avail}$ indicating the allowable charge/discharge current or the allowable charge/discharge power by the SOC calculation section 105 and the allowable power calculation section 106 in consideration of the plurality of resistance components including the DC resistance component $R_O$ and the polarization resistance component $R_p$. This battery management system 100 has the battery information acquisition section 103 and the voltage calculation section 104 as a plurality of computation means for obtaining the voltage value V and the predicted battery voltage value $V_{model}$ both indicating the voltage value of the storage battery 101, and the resistance correction amount calculation section 111 as a correction means for changing at least one of the contribution degrees of the DC resistance component $R_O$ and the polarization resistance component $R_p$ for the computations of the SOC or the allowable value $P_{avail}$ in the SOC calculation section 105 or the allowable power calculation section 106 according to the comparison result of the voltage value V and the predicted battery voltage value $V_{model}$ obtained by the battery information acquisition section 103 and the voltage calculation section 104, respectively, and according to the fluctuation amount dI/dt of the current of the storage battery 101 per unit time. That is, the battery management system 100 includes the battery information acquisition section 103, the voltage calculation section 104, the current fluctuation amount calculation section 109 and the resistance correction amount calculation section 111. The battery information acquisition section 103 acquires the voltage value V of the storage battery 101 being energized (Step S102). The voltage calculation section 104 acquires the predicted battery voltage value $V_{model}$ of the storage battery 101 being energized by a method different from that of the battery information acquisition section 103 (Step S103). The current fluctuation amount calculation section 109 calculates the current fluctuation amount dI/dt of the storage battery 101 per unit time (Step S106). Based on the comparison result of the voltage value V and the predicted battery voltage value $V_{model}$ and the current fluctuation amount dI/dt, the resistance correction amount calculation section 111 corrects the equivalent circuit model expressing the internal state of the storage battery 101 including the DC resistance component $R_0$ and the polarization resistance component $R_p$ (Step S108). In this way, it is possible to appropriately express the state of the internal resistance for the battery being energized.

(2) The battery information acquisition section 103 acquires the voltage measurement value of the storage battery 101 being energized as the voltage value V. Moreover, the voltage calculation section 104 acquires the predicted battery voltage value $V_{model}$ by the calculation based on the equivalent circuit model. In this way, it is possible to surely acquire these voltage values by different methods from each other in the battery information acquisition section 103 and the battery information acquisition section 103.

(3) The battery management system 100 further includes the deviation degree calculation section 108 which obtains the deviation degree δ between the voltage value V and the predicted battery voltage value $V_{model}$. Based on the deviation degree δ obtained by the deviation degree calculation section 108 and the current fluctuation amount dI/dt, the resistance correction amount calculation section 111 corrects the equivalent circuit model. In this way, it is possible to appropriately correct the equivalent circuit model in consideration of the difference in the characteristics between the voltage V and the predicted battery voltage value $V_{model}$.

(4) The battery management system 100 further includes the resistance correction distribution calculation section 110 which determines the correction distributions $β_0$ and $β_p$ for the DC resistance component $R_0$ and the polarization resistance component $R_p$ based on the current fluctuation amount dI/dt. Based on the deviation degree δ obtained by the deviation degree calculation section 108 and the determined correction distributions N and 4, the resistance correction amount calculation section 111 corrects the equivalent circuit model. In this way, it is possible to correct the DC resistance component $R_0$ and the polarization resistance component $R_p$ according to the deviation degree δ by the respective appropriate distributions.

(5) The resistance correction distribution calculation section 110 determines the correction distributions $β_0$ and $β_p$ based on the correction distribution information which is stored in advance and indicates the relationships between the current fluctuation amount dI/dt and the correction distributions $β_0$ and $β_p$. In this way, it is possible to easily determine the correction distributions $β_0$ and $β_p$ from the current fluctuation amount dI/dt.

(6) The correction distribution information described above is set so that, for example, as shown in FIGS. 5 to 7, the correction distribution $β_0$ for the DC resistance component $R_0$ and the correction distribution $β_p$ for the polarization resistance component $R_p$ are changed in inverse correlation for the change in the current fluctuation amount dI/dt. In this way, it possible to obtain the correction distribution information that appropriately reflects the difference in the characteristics between the DC resistance component $R_0$ and the polarization resistance component $R_p$ for the current fluctuation amount dI/dt.

(7) The battery management system 100 further includes the allowable power calculation section 106 which calculates the allowable value $P_{avail}$ corresponding to the allowable current or the allowable power for the storage battery 101 based on the equivalent circuit model corrected by the resistance correction amount calculation section 111. In this way, it is possible to appropriately control the charge/discharge according to the state of the storage battery 101.

Second Embodiment

Figure 9:
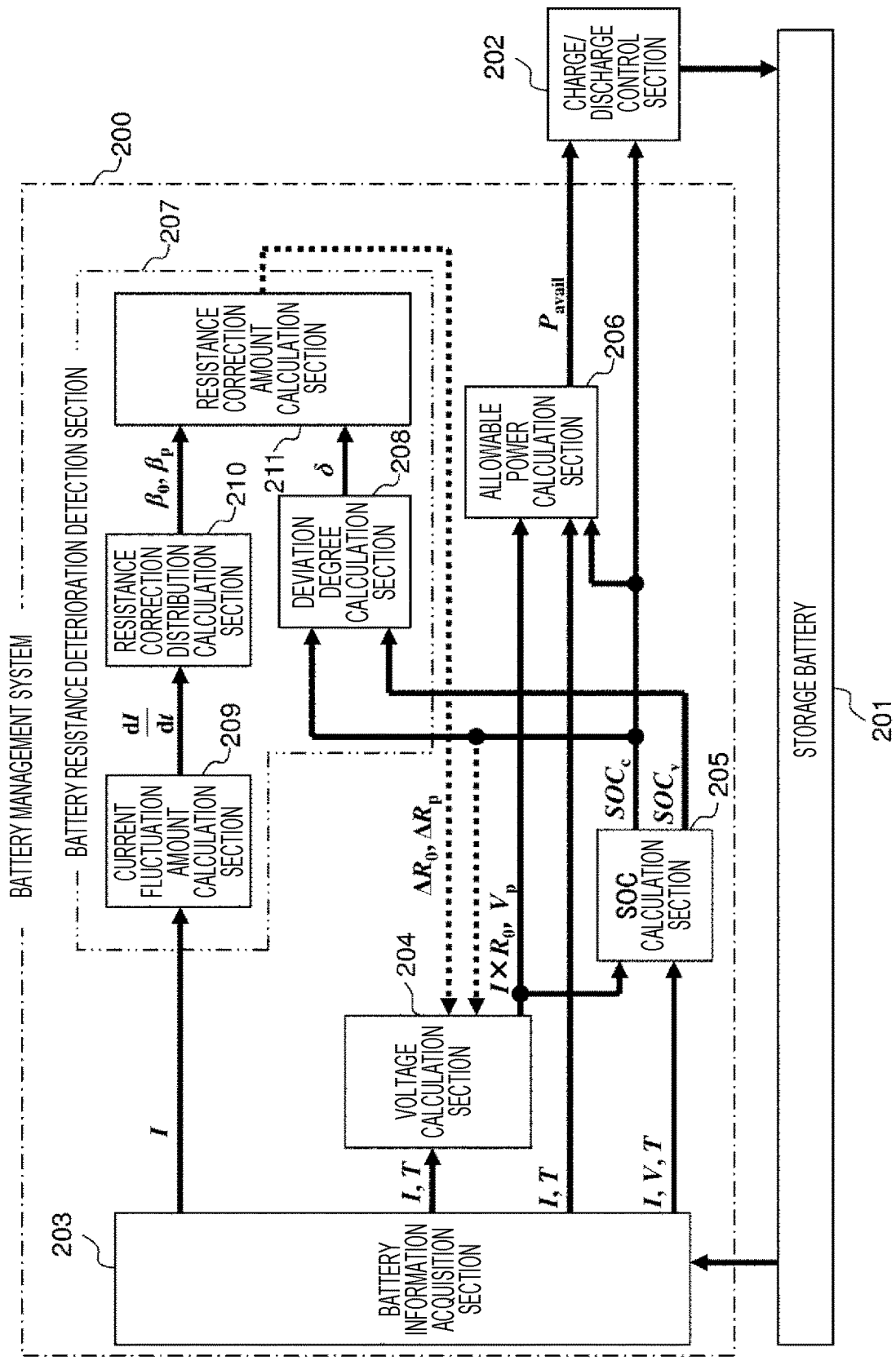
FIG. 9 is a diagram showing a second embodiment of the battery system according to the present invention.
Figure 10:
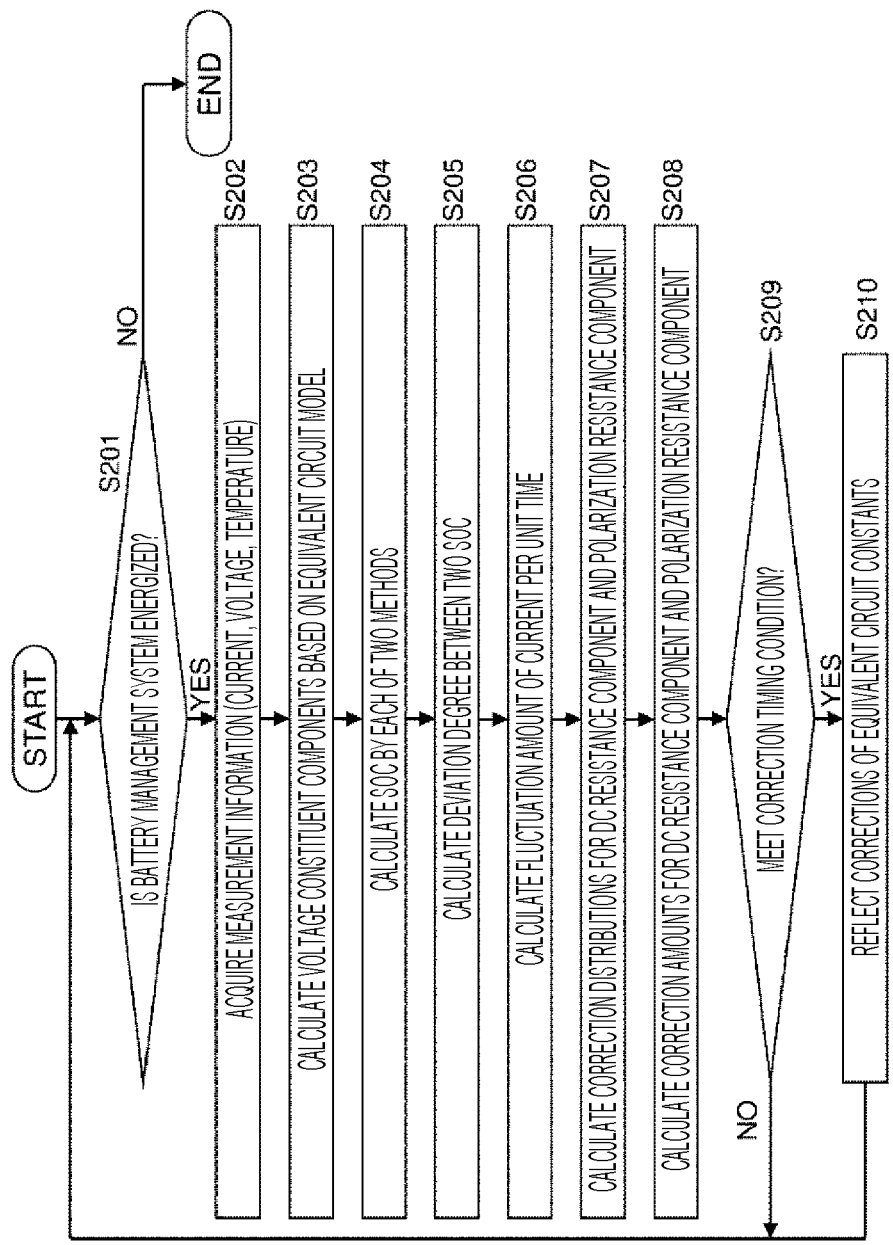
FIG. 10 is a diagram showing one example of a control flowchart according to the second embodiment.

FIGS. 9 and 10 are diagrams for explaining a second embodiment of the battery management system according to the present invention. Similarly to the first embodiment, for example, a battery system of the present embodiment is mounted on a hybrid vehicle such as an HEV or a PHEV.

FIG. 9 is a block diagram showing the minimum configuration of a battery system 2 according to the second embodiment of the present invention. The battery system 2 includes a battery management system 200, a storage battery 201 and a charge/discharge control section 202. The storage battery 201 includes a plurality of storage elements (e.g., lithium ion secondary battery cells).

The battery management system 200 includes a battery information acquisition section 203, a voltage calculation section 204, an SOC calculation section 205, an allowable power calculation section 206 and a battery resistance deterioration detection section 207. The battery resistance deterioration detection section 207 includes a deviation degree calculation section 208, a current fluctuation amount calculation section 209, a resistance correction distribution calculation section 210 and a resistance correction amount calculation section 211.

Similarly to the battery information acquisition section 103 in FIG. 1 according to the first embodiment, the battery information acquisition section 203 acquires measurement information, such as a current I, a voltage V and temperature T, based on signals outputted from a voltage sensor, a current sensor, a temperature sensor and the like attached to the storage battery 201 or the periphery thereof. Then, the measurement information is outputted to each of the voltage calculation section 204, the SOC calculation section 205, the allowable power calculation section 206 and the current fluctuation amount calculation section 209.

Similarly to the voltage calculation section 104 in FIG. 1 according to the first embodiment, an equivalent circuit model expressing the internal state of the storage battery 101 is stored in advance in the voltage calculation section 204. By using this equivalent circuit model, an open circuit voltage OCV, a DC voltage component $I×R_0$ and a polarization voltage component $V_p$, which are the constituent components of the battery voltage, are calculated, and these calculation results are outputted to the SOC calculation section 205 and the allowable power calculation section 206.

Based on the current I, the voltage V and the temperature T outputted from the battery information acquisition section 203 and the OCV, the $I×R_0$ and the $V_p$ calculated by the voltage calculation section 204, the SOC calculation section 205 calculates the SOC of the storage battery 201 by two methods different from each other. For example, the SOC calculation section 205 calculates the SOC by the SOCv method based on the OCV as well as calculates the SOC by the SOCi method based on the history of the current I. Note that, the SOC may be calculated by a SOCc method in which the SOCv method and SOCi method are combined, instead of the SOCv method and the SOCi method. In the following description, an example will be described in a case where the SOC calculation section 205 calculates the SOC by the SOCv method and outputs the calculation result as the SOCv to the deviation degree calculation section 208 as well calculates the SOC by the SOCc method and outputs the calculation result as the SOCc to the deviation degree calculation section 208, the allowable power calculation section 206, the charge/discharge control section 202 and the voltage calculation section 204.

Similarly to the allowable power calculation section 106 in FIG. 1 according to the first embodiment, based on the current I and the temperature T outputted from the battery information acquisition section 203, the OCV, the I×R$_0$ and the V$_p$ calculated by the voltage calculation section 204, and the SOCc outputted from the SOC calculation section 205, the allowable power calculation section 206 calculates an allowable value P$_{avail}$ for the charge/discharge of the storage battery 201. The allowable power calculation section 206 outputs the calculation result of the allowable value P$_{avail}$ to the charge/discharge control section 202.

Based on the two kinds of SOCs, that is, the SOCv and the SOCc, from the SOC calculation section 205, the deviation degree calculation section 208 calculates a deviation degree δ between these SOCs. The deviation degree calculation section 208 outputs the calculated deviation degree δ to the resistance correction amount calculation section 211.

Similarly to the current fluctuation amount calculation section 109 in FIG. 1 according to the first embodiment, based on the current I outputted from the battery information acquisition section 203, the current fluctuation amount calculation section 209 calculates a current fluctuation amount dI/dt of the storage battery 201 per unit time from the previous computed time to the present time. The current fluctuation amount calculation section 209 outputs the calculated current fluctuation amount dI/dt to the resistance correction distribution calculation section 210.

Similarly to the resistance correction distribution calculation section 110 in FIG. 1 according to the first embodiment, based on the current fluctuation amount dI/dt outputted from the current fluctuation amount calculation section 209, the resistance correction distribution calculation section 210 calculates correction distributions β$_0$ and β$_p$ for the DC resistance component R$_0$ and the polarization resistance component R$_p$ in the equivalent circuit model, respectively.

Similarly to the resistance correction amount calculation section 111 in FIG. 1 according to the first embodiment, based on the deviation degree δ outputted from the deviation degree calculation section 208 and the correction distributions β$_0$ and β$_p$ outputted from the resistance correction distribution calculation section 210, the resistance correction amount calculation section 211 calculates a correction amount ΔR$_0$ for the DC resistance component R$_0$ and a correction amount ΔR$_p$ for the polarization resistance component R$_p$. The resistance correction amount calculation section 211 outputs the calculated correction amounts ΔR$_0$ and ΔR$_p$ to the voltage calculation section 204 to correct the DC resistance component R$_0$ and the polarization resistance component R$_p$ of the equivalent circuit model stored in the voltage calculation section 204.

In the battery resistance deterioration detection section 207, the correction amounts ΔR$_0$ and ΔR$_p$ for correcting the equivalent circuit model can be calculated based on the values of two kinds of the SOC by each of the operations of the deviation degree calculation section 208, the current fluctuation amount calculation section 209, the resistance correction distribution calculation section 210 and the resistance correction amount calculation section 211 as described above.

Similarly to the charge/discharge control section 102 in FIG. 1 according to the first embodiment, based on the calculation result of the SOCc outputted from the SOC calculation section 205 and the calculation result of the allowable value P$_{avail}$ outputted from the allowable power calculation section 206, the charge/discharge control section 202 controls the charge/discharge current flowing in the storage battery 201.

FIG. 10 is a diagram showing one example of a control flowchart according to the second embodiment of the present invention. This control program is executed in the battery management system 200 in FIG. 9. The series of processing shown in FIG. 10 is performed with predetermined time intervals.

In Step S201, whether or not the battery management system 200 is energized is determined. The processing is stopped if the battery management system 200 is not energized. The processing proceeds to Step S202 if the battery management system 200 is energized. Herein, the predetermined time is a time interval indicating a control cycle for calculating the resistance correction amounts based on the present invention. For example, a time of 0.1 seconds or the like is selected.

In Step S202, the battery information acquisition section 203 acquires the measurement information such as the current I, the voltage V and the temperature T of the storage battery 201.

In Step S203, by using the measurement values of the current I and the temperature T acquired in Step S202 and the present SOC value, the voltage calculation section 204 computes the OCV, the DC voltage component I×R$_0$ and the polarization voltage component V$_p$ based on the equivalent circuit model expressing the internal state of the storage battery 201.

In Step S204, the SOC calculation section 205 calculates the SOC by each of the two methods based on the measurement values of the current I, the voltage V and the temperature T acquired in Step S202 and the OCV, the DC voltage component I×R$_0$ and the polarization voltage component V$_p$ obtained in Step S203. Specifically, the SOC calculation section 205 obtains the SOCv by the SOCv method as well as obtains the SOCc by the SOCc method which combines the SOCv method and the SOCi method by using these values, thereby calculating two kinds of charging rates (SOCv and SOCc). Note that an SOC by other method, for example, an SOCi obtained by the SOCi method, or the like may be used.

In Step S205, the deviation degree calculation section 208 calculates the deviation degree δ between the SOC by the two methods, that is, SOCv and SOCc obtained in Step S204. Herein, the above deviation degree δ may be any index appropriately indicating a difference in the characteristics between the SOCv and the SOCc. For example, a difference between the SOCv and the SOCc or a ratio thereof can be used. In addition, various values obtained from the SOCv and the SOCc can be used as the deviation degree δ.

In Step S206, based on the measurement value of the current I acquired in Step S202, the current fluctuation amount calculation section 209 calculates the current fluctuation amount dI/dt of the storage battery 201 per unit time.

In Step S207, based on the current fluctuation amount dI/dt per unit time obtained in Step S206, the resistance correction distribution calculation section 210 calculates the correction distributions β$_0$ and β$_p$ for the DC resistance component R$_0$ and the polarization resistance component R$_p$ in the equivalent circuit model, respectively. Herein, similarly to Step S107 in FIG. 2 according to the first embodiment, based on the correction distribution information, which is stored in the resistance correction distribution calculation section 210 in advance as shown in FIGS. 5 to 7, the correction distributions $\beta_O$ and $\beta_p$ for the DC resistance component $R_O$ and polarization resistance component $R_p$ according to the value of the present current fluctuation amount dI/dt are determined.

In Step S208, based on the deviation degree δ obtained in Step S205 and the correction distributions $\beta_O$ and $\beta_p$ for the DC resistance component $R_O$ and the polarization resistance component $R_p$ obtained in Step S207, the resistance correction amount calculation section 211 calculates a correction amount for correcting each of the values of the DC resistance component $R_O$ and the polarization resistance component $R_p$. Specifically, similarly to Step S108 in FIG. 2 according to the first embodiment, by multiplying the correction distribution $\beta_O$ for the DC resistance component $R_O$ and the correction distribution $\beta_p$ for the polarization resistance component $R_p$ by the deviation degree δ, the resistance correction amount calculation section 211 computes the correction amount for each of the DC resistance component $R_O$ and the polarization resistance component $R_p$. By outputting the correction amounts thus obtained to the voltage calculation section 204 from the resistance correction amount calculation section 211, the resistance correction amount calculation section 211 can correct the equivalent circuit model of the storage battery 201 stored in the voltage calculation section 204.

In Step S209, whether or not a correction timing condition is met is determined. If the correction timing condition is met, the processing proceeds to Step S210. If the correction timing condition is not met, the processing returns to Step S201. Herein, similarly to Step S109 in FIG. 2 according to the first embodiment, for example, it is possible to determine that the correction timing condition is met when a predetermined time or more has elapsed since the previous correction, or at a timing when highly accurate correction results can be obtained.

In Step S210, the voltage calculation section 204 reflects the correction amounts for the DC resistance component $R_O$ and the polarization resistance component $R_p$ obtained in Step S208 in the equivalent circuit constants of the equivalent circuit model. Thus, the corrections of the equivalent circuit model by the resistance correction amount calculation section 211 are applied in the voltage calculation section 204. After applying the corrections in this way, the processing returns to Step S201. Note that, herein, the corrections are applied only when the correction timing condition is determined to be met in Step S209, but, similarly to the first embodiment, the corrections may be always performed continuously so that the correction amounts obtained according to the determination result in Step S209 are weighted.

According to the second embodiment of the present invention described above, the following operational effects are exerted.

(1) The battery management system 200 calculates at least one of the SOC of the storage battery 201 and the allowable value $P_{avail}$ indicating the allowable charge/discharge current or the allowable charge/discharge power by the SOC calculation section 205 and the allowable power calculation section 206 in consideration of the plurality of resistance components including the DC resistance component $R_O$ and the polarization resistance component $R_p$. This battery management system 200 has the SOC calculation section 205 as a plurality of computation means for obtaining the SOCv and the SOCc, both indicating the charging rate of the storage battery 201, and the resistance correction amount calculation section 211 as a correction means for changing at least one of the contribution degrees of the DC resistance component $R_O$ and the polarization resistance component $R_p$ for the computations of the SOC or the allowable value $P_{avail}$ in the SOC calculation section 205 or the allowable power calculation section 206 according to the comparison result of the SOCv and the SOCc obtained by the SOC calculation section 205 and the fluctuation amount dI/dt of the current of the storage battery 201 per unit time. That is, the battery management system 200 includes the SOC calculation section 205, the current fluctuation amount calculation section 209 and the resistance correction amount calculation section 211. The SOC calculation section 205 obtains a first SOC indicating the state of charge of the storage battery 201 being energized as well as acquires a second SOC indicating the state of charge of the storage battery 201 being energized by a different method (Step S204). The current fluctuation amount calculation section 209 calculates the current fluctuation amount dI/dt of the storage battery 201 per unit time (Step S206). Based on the comparison result of the first SOC and the second SOC and the current fluctuation amount dI/dt, the resistance correction amount calculation section 211 corrects the equivalent circuit model expressing the internal state of the storage battery 201 including the DC resistance component $R_O$ and the polarization resistance component $R_p$ (Step S208). In this way, similarly to the first embodiment, it is possible to appropriately express the state of the internal resistance for the battery being energized.

(2) The SOC calculation section 205 acquires the SOCv as the first SOC, for example, by the SOCv method based on the OCV of the storage battery 201 calculated based on the equivalent circuit model. Moreover, the SOC calculation section 205 acquires the SOCi or the SOCc as the second SOC, for example, by the SOCi method or the SOCc method based on the history of the current measurement value I of the storage battery 201 being energized. In this way, it is possible to surely acquire these states of charge by different methods from each other in the SOC calculation section 205.

(3) The battery management system 200 further includes the deviation degree calculation section 208 which obtains the deviation degree δ between the first SOC and the second SOC. Based on the deviation degree δ obtained by the deviation degree calculation section 208 and the current fluctuation amount dI/dt, the resistance correction amount calculation section 211 corrects the equivalent circuit model. In this way, it is possible to appropriately correct the equivalent circuit model in consideration of the difference in the characteristics between the first SOC and the second SOC.

(4) The battery management system 200 further includes the resistance correction distribution calculation section 210 which determines the correction distributions $\beta_O$ and $\beta_p$ for the DC resistance component $R_O$ and the polarization resistance component $R_p$ based on the current fluctuation amount dI/dt. Based on the deviation degree δ obtained by the deviation degree calculation section 208 and the determined correction distributions $\beta_O$ and $\beta_p$, the resistance correction amount calculation section 211 corrects the equivalent circuit model. In this way, similarly to the first embodiment, it is possible to correct the DC resistance component $R_O$ and the polarization resistance component $R_p$ according to the deviation degree δ by the respective appropriate distributions.

(5) The resistance correction distribution calculation section 210 determines the correction distributions $\beta_O$ and $\beta_p$ based on the correction distribution information which is stored in advance and indicates the relationships between the current fluctuation amount dI/dt and the correction distributions $\beta_0$ and $\beta_p$. In this way, similarly to the first embodiment, it is possible to easily determine the correction distributions $\beta_0$ and $\beta_p$ from the current fluctuation amount dI/dt.

(6) The correction distribution information described above is set so that, for example, as shown in FIGS. 5 to 7, the correction distribution $\beta_0$ for the DC resistance component $R_0$ and the correction distribution $\beta_p$ for the polarization resistance component $R_p$ are changed in inverse correlation for the change in the current fluctuation amount dI/dt. In this way, similarly to first embodiment, it possible to obtain the correction distribution information that appropriately reflects the difference in the characteristics between the DC resistance component $R_0$ and the polarization resistance component $R_p$ for the current fluctuation amount dI/dt.

(7) The battery management system 200 further includes the allowable power calculation section 206 which calculates the allowable value $P_{avail}$ corresponding to the allowable current or allowable power for the storage battery 201 based on the equivalent circuit model corrected by the resistance correction amount calculation section 211. In this way, similarly to the first embodiment, it is possible to appropriately control the charge/discharge according to the state of the storage battery 201.

Third Embodiment

Figure 11:
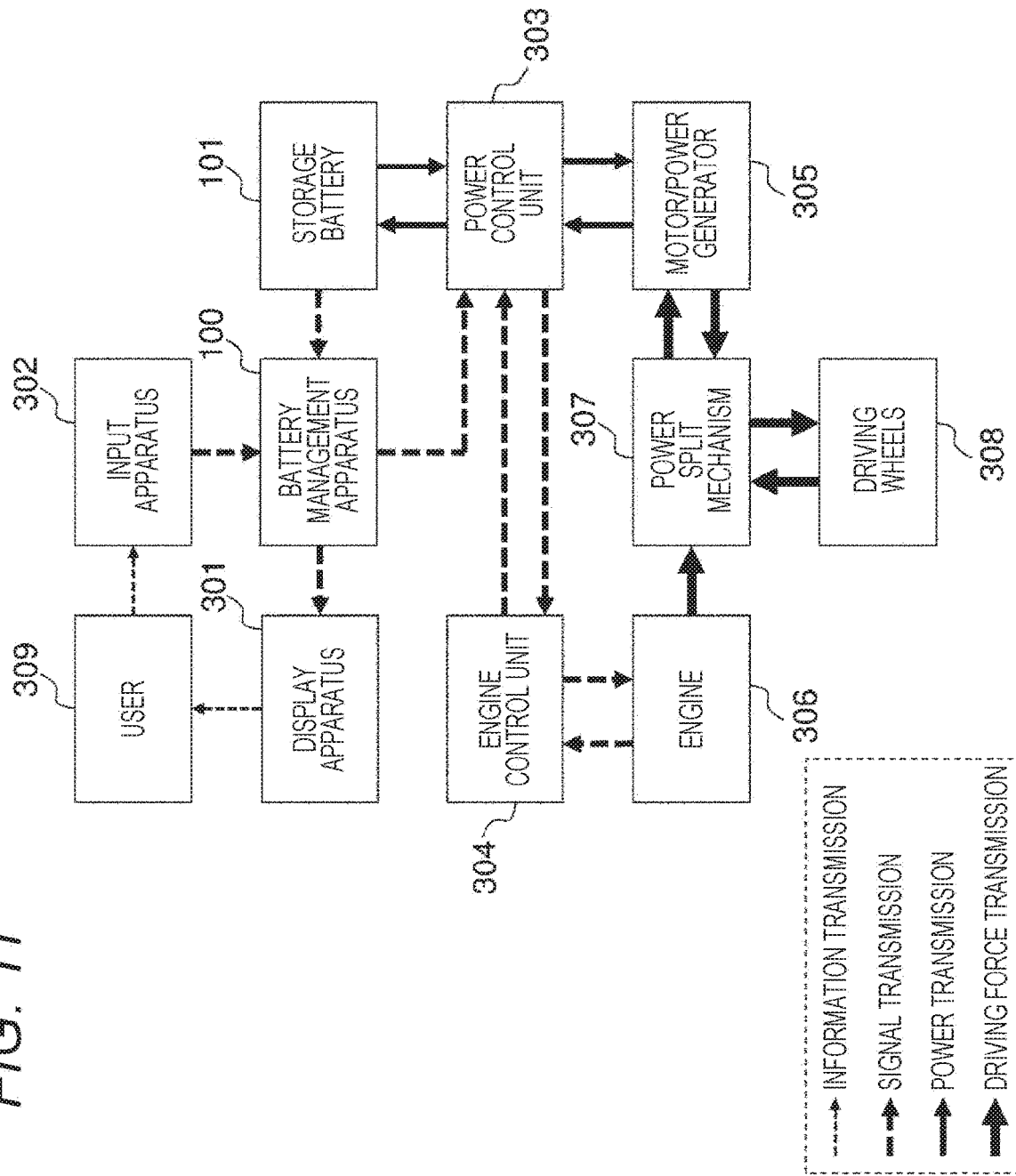
FIG. 11 is a diagram showing one example of a hybrid vehicle control system.

FIG. 11 shows one example of a vehicle control system (hybrid vehicle control system) according to a third embodiment of the present invention. This hybrid vehicle control system 3 includes the battery management system 100 and the storage battery 101 in FIG. 1 described in the first embodiment, a display apparatus 301 which displays a control state to a user 309, an input apparatus 302 with which the user 309 can operate as to whether or not to execute the present control, a power control unit 303, an engine control unit 304, a motor/power generator 305, an engine 306, a power split mechanism 307, and driving wheels 308. Note that the battery management system 100 and the storage battery 101 are included in the example in FIG. 11, but the battery management system 200 and the storage battery 201 in FIG. 9 described in the second embodiment may be included instead. Hereinafter, an example of a case will be described where the battery management system 100 and the storage battery 101 are included.

From the battery management system 100, the allowable charge/discharge power, which is one of the limit values of the battery performance, is outputted to the power control unit 303 which is the host controller. The power control unit 303 drives and controls the motor/power generator 305 based on the allowable charge/discharge power from the battery management system 100. The power control unit 303 and the engine control unit 304 exchange information with each other. The engine control unit 304 controls the operation of the engine 306.

When the allowable charge/discharge power outputted from the battery management system 100 becomes large, the driving force distribution for the motor at the time of driving the vehicle is made large, and the driving force distribution for the engine is made small. On the contrary, when the allowable charge/discharge electric power outputted from the battery management system 100 becomes small, the driving force distribution for the motor at the time of driving the vehicle is made small, and the driving force distribution for the engine is made large.

Although various embodiments have been described above, the present invention is not limited to these contents. Other aspects, which can be considered in a scope within the technical idea of the present invention, are also included within the scope of the present invention.

REFERENCE SIGNS LIST 1, 2 battery system
100, 200 battery management system
101, 201 storage battery
102, 202 charge/discharge control section
103, 203 battery information acquisition section
104, 204 voltage calculation section
105, 205 SOC calculation section
106, 206 allowable power calculation section
107, 207 battery resistance deterioration detection section
108, 208 deviation degree calculation section
109, 209 current fluctuation amount calculation section
110, 210 resistance correction distribution calculation section
111, 211 resistance correction amount calculation section
hybrid vehicle control system
301 display apparatus
302 input apparatus
303 power control unit
304 engine control unit
305 motor/power generator
306 engine
307 power split mechanism
308 driving wheels
309 user

The invention claimed is:

1. A battery management system, comprising:
a battery manager; and
a secondary battery managed by the battery manager, wherein the battery manager is configured to:
acquire a voltage value of the secondary battery being energized as a first voltage value;
acquire a voltage value of the secondary battery being energized as a second voltage value by a method different from that associated with the first voltage value;
calculate a current fluctuation amount of the secondary battery per unit time;
correct an equivalent circuit model expressing an internal state of the secondary battery including a DC resistance component and a polarization resistance component based on a comparison result of the first voltage value and the second voltage value and the current fluctuation amount;
calculate an allowable current or allowable power of the secondary battery based on the corrected equivalent circuit model; and
control a charge/discharge current of the secondary battery based on the allowable current or the allowable power.

2. The battery management system according to claim 1, wherein the battery manager is also configured to:
acquire a voltage measurement value of the secondary battery being energized as the first voltage value, and acquire the second voltage value by calculation based on the equivalent circuit model.

3. The battery management system according to claim 2, wherein the battery manager is also configured to:
    obtain a deviation degree between the first voltage value and the second voltage value, and
    correct the equivalent circuit model based on the obtained deviation degree and the current fluctuation amount.

4. The battery management system according to claim 3, wherein the battery manager is also configured to:
    determine correction distributions for the DC resistance component and the polarization resistance component based on the current fluctuation amount, and
    correct the equivalent circuit model based on the obtained deviation degree and the correction distributions.

5. The battery management system according to claim 4, wherein the battery manager is also configured to:
    determine the correction distributions based on correction distribution information which is stored in advance, and indicate relationships between the current fluctuation amount and the correction distributions.

6. The battery management system according to claim 5, wherein the correction distribution information is set such that a correction distribution for the DC resistance component and a correction distribution for the polarization resistance component are changed in inverse correlation for a change in the current fluctuation amount.

7. A hybrid vehicle control system, comprising:
    an engine and a motor provided through a power split mechanism; and
    the battery management system according to claim 1, wherein
        driving force distributions for the engine and the motor are controlled according to a control of the charge/discharge current.

* * * * *